United States Patent [19]
Blair

[11] Patent Number: 4,779,028
[45] Date of Patent: Oct. 18, 1988

[54] DIGITAL STORAGE OSCILLOSCOPE WITH MARKER FOR TRIGGER LOCATION

[75] Inventor: Bruce W. Blair, Beaverton, Oreg.

[73] Assignee: Tektronix, Inc., Beaverton, Oreg.

[21] Appl. No.: 905,912

[22] Filed: Sep. 9, 1986

[51] Int. Cl.$^4$ .................... H01J 29/70; G01R 13/30; G01R 27/02

[52] U.S. Cl. .................... 315/367; 315/377; 364/487; 328/189

[58] Field of Search ............... 315/367, 377; 328/189, 328/188; 324/404; 340/734, 721, 709; 364/387, 518, 521, 487

[56] References Cited

U.S. PATENT DOCUMENTS

| | | | |
|---|---|---|---|
| 3,859,556 | 1/1975 | Schumann | 315/377 |
| 4,072,851 | 2/1978 | Rose | 324/121 R |
| 4,092,567 | 5/1978 | Sarrit | 315/377 |
| 4,642,519 | 2/1987 | Nakatsugawa et al. | 315/367 |

*Primary Examiner*—Theodore M. Blum
*Assistant Examiner*—Gregory C. Issing
*Attorney, Agent, or Firm*—John Smith-Hill

[57] ABSTRACT

A digital storage oscilloscope comprises an analog-to-digital converter for receiving an analog input signal and generating a succession of data words representative of the instantaneous magnitude of the input signal at a succession of equally-spaced sample times. A waveform memory has a plurality of separately addressable storage locations for storing the succession of data words at locations of which the addresses are related to the respective sample times. A trigger circuit compares the instantaneous magnitude of the analog input signal with a predetermined trigger level and generates a trigger pulse when the instantaneous magnitude of the input signal bears a predetermined relationship to the trigger level. The trigger circuit also causes an address word to be stored that defines the storage location for the first data word that occurs after the trigger pulse. The stored address word and the data word stored at the location defined by the stored address word are used to cause a visually distinct marker to be generated on the screen of the oscilloscope at a location that represents the time of occurrence of the trigger pulse.

7 Claims, 1 Drawing Sheet

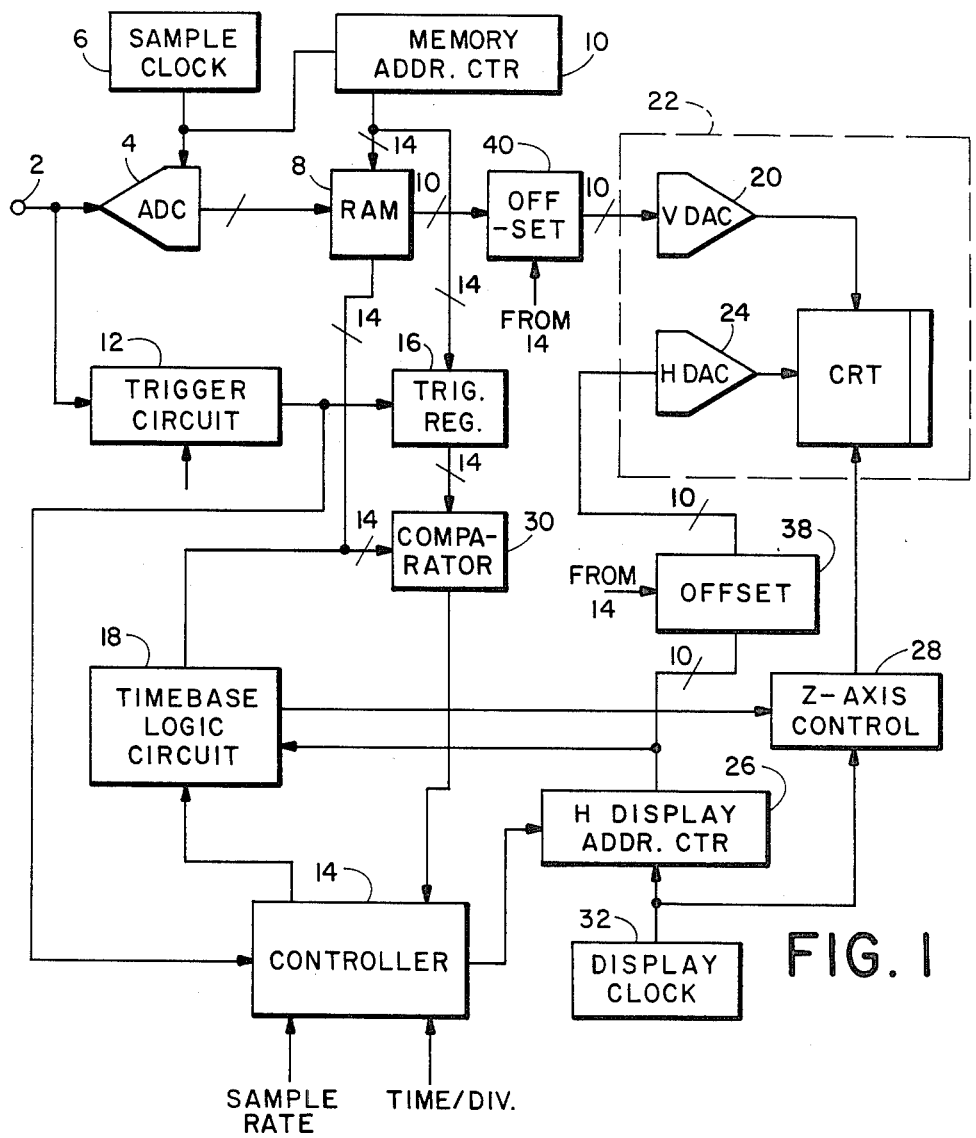
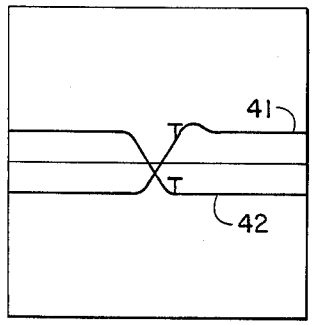
FIG. 2
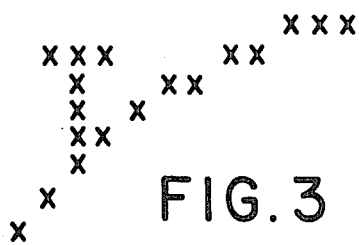
FIG. 3

DIGITAL STORAGE OSCILLOSCOPE WITH MARKER FOR TRIGGER LOCATION

This invention relates to digital storage oscilloscope with a marker for trigger location.

BACKGROUND OF THE INVENTION

An oscilloscope is used to provide a visual representation of the waveform of a signal. In the case of an analog oscilloscope, the horizontal sweep is initiated in response to a trigger pulse, which may be generated when the voltage of the input signal passes through a predetermined trigger level in a selected direction, i.e. positive going or negative going. Therefore, the time of occurrence of the trigger pulse is implicit in the information provided on the oscilloscope screen.

A digital storage oscilloscope (DSO) has two distinct modes of operation. In the acquisition mode, the DSO acquires an analog input signal by sampling the input signal at predetermined times, quantizing the successive samples so as to generate a succession of digital words representative of the magnitudes of the respective samples, and writing the digital words into memory locations that are related to the respective sample times. The DSO responds to a trigger pulse by initiating a sequence of operations associated with terminating the signal acquisition. In the display mode, the contents of the waveform memory are used to generate a display, with greater or lesser resolution in the time dimension, of the waveform of the signal during the interval over which the acquisition took place. The display interval (that portion of the acquisition interval which is displayed) may include the trigger point, but even if it does, the position of the trigger point has no necessary relationship to the position of the waveform displayed on the oscilloscope screen. It is conventional for a DSO to include a text generator that causes an alphanumeric representation of the operating mode of the oscilloscope to be displayed on the oscilloscope screen. In particular, this alphanumeric information may include the trigger voltage level. Although the numerical value of the trigger voltage is displayed, this does not provide immediate visual identification of the trigger point with reference to features of the displayed waveform.

SUMMARY OF THE INVENTION

A preferred embodiment of the present invention is a digital storage oscilloscope comprising an analog-to-digital converter for receiving an analog input signal and generating a succession of data words representative of the instantaneous magnitude of the input signal at a succession of equally-spaced sample times. A waveform memory has a plurality of separately addressable storage locations for storing the succession of data words at locations of which the addresses are related to the respective sample times. A trigger circuit compares the instantaneous magnitude of the analog input signal with a predetermined trigger level and generates a trigger pulse when the instantaneous magnitude of the input signal bears a predetermined relationship to the trigger level. The trigger circuit also causes an address word to be stored that defines the storage location for the first data word that occurs after the trigger pulse. The stored address word and the data word stored at the location defined by the stored address word are used to cause a visually distinct marker to be generated on the screen of the oscilloscope at a location that represents the time of occurrence of the trigger pulse.

BRIEF DESCRIPTION OF THE DRAWINGS

For a better understanding of the invention, and to show how the same may be carried into effect, reference will now be made, by way of example, to the accompanying drawings in which:

FIG. 1 is a block diagram of a digital storage oscilloscope embodying the present invention, FIG. 2 is a schematic representation of a display provided by the FIG. 1 oscilloscope, and FIG. 3 is a detail of FIG. 2.

DETAILED DESCRIPTION

The DSO illustrated in FIG. 1 has an input terminal 2 at which it receives an analog input signal. The DSO comprises an analog-to-digital converter (ADC) 4 which samples the analog signal that appears at the terminal 2 under control of a sample clock 6 and quantizes the successive samples so as to generate a stream of digital words. The digital words generated by the ADC 4 are applied to a waveform memory 8 and are written into locations within the memory 8 that are defined by address words that are generated by a memory address counter 10 which also operates under control of the sample clock 6. In this manner, a waveform record is created and is stored in the waveform memory 8. The waveform memory may have, e.g., 4096 storage locations. Therefore, the address words generated by the counter 10 have 12 bits. If the sample rate control of the DSO is set to 50 ns/sample, the waveform record represents the waveform of the input signal over an acquisition interval of about 200 $\mu$s (4096 × 50 ns).

The input terminal 2 is connected to a trigger circuit 12. The trigger circuit 12 generates a trigger pulse when a trigger event occurs. The trigger circuit may be a comparator that compares the voltage level of the input signal with a selected voltage level and generates a trigger pulse when the voltage of the input signal passes through the trigger level in the positive-going direction. The trigger pulse is applied to a controller 14 that responds to the trigger pulse by initiating the sequence of operations required to terminate the signal acquisition. The signal acquisition terminates when the memory is filled so that it contains a waveform record of 4096 digital data words.

The trigger pulse is also applied as a write enable input to a trigger address register 16 which receives at its data input the sequence of addresses provided by the address counter 10. The first address word generated by the address counter 10 after the trigger pulse is therefore written into the trigger address register 16.

The DSO includes a CRT display device 22 having a display screen. Horizontal and vertical deflection signals are applied to the display device by 10-bit horizontal and vertical digital-to-analog converters (DACs) 20 and 24. The digital words that are applied to the vertical DAC 20 are read out of the memory 8 under control of a time-base logic circuit 18. The digital words applied to the DAC 20 cause a vertical deflection signal having 1024 possible values to be generated. The digital words that are applied to the horizontal DAC 24 are generated by a horizontal display address counter 26 under control of a display clock 32. The counter 26 generates a sequence of 1024 horizontal display address words that, when applied to the DAC 24, generate a horizontal deflection signal that causes the electron beam of the display device to scan horizontally across the screen of the CRT in 1024 equal steps. The display device has a graticule that divides the screen of the CRT horizontally and vertically into 10.24 divisions. Thus, there are 100 possible display points per division in both the horizontal direction and the vertical direction. A Z-axis control 28 is used to blank the electron beam of the CRT when it is being deflected from display point to display point. The timebase logic circuit 18 also causes the control 28 to blank the electron beam so that only selected display points are addressed.

When the oscilloscope operates in the display mode, the controller 14 causes the timebase logic circuit 18 to receive the sequence of horizontal display address words generated by the counter 26 and also to receive information from the controller relating to the sample rate with which the waveform record was acquired and the setting of the time/division setting. The timebase logic circuit uses this information to select a set of memory address words, and applies these address words to the memory 8 synchronously with application of display address words by the counter 26 to the horizontal DAC 24. These address words define locations that span the location defined by the address word stored in the trigger address register 16. The data words stored at the locations defined by the memory address words are read out and applied sequentially to the vertical DAC 20 as vertical display address words.

The number of display points that are actually addressed by the display device is determined by the time/division control and by the sampling rate. If, for example, the waveform record had been formed with the sample rate control set to 50 ns/sample, so that the waveform record represents an acquisition interval of about 200 $\mu$s (50 ns$\times$4096 samples) and in the display mode the time/division control was set to 50 ns/div, only 10 display points, representing a display interval of 500 ns, would be shown. If the time/division control was set to 20 ms/div, the display interval would be about 200 ms and 1024 display points would be shown. However, only every fourth sample in the display record would be used to form the display. If the time/division control was set to 5 ms/div, the display interval would be 50 ms and a contiguous block of 1024 samples would be used to form the display. The set of memory address words that is generated by the timebase logic circuit 18 therefore depends on the initial sample rate and the time/division setting, as communicated to the timebase logic circuit by the controller 14.

When the display is generated using less than 1024 samples, horizontal display address words are generated by the counter 26 for which no corresponding memory address words are generated by the timebase logic circuit 18. The Z-axis control circuit unblanks the electron beam of the CRT when the horizontal display address word generated by the counter 26 corresponds to a memory address word generated by the circuit 18.

The memory address words generated by the timebase logic circuit 18 are also applied to a comparator 30 that receives as its other input the word stored in the trigger register 16 and representing the location within the waveform memory 8 of the data word that occurred immediately following the trigger pulse. The comparator 30 generates an output pulse when the timebase logic circuit 18 generates a memory address word that is the same as the word stored in the register 16 or defines a location in the memory 8 that was filled after the location defined by the address stored in the trigger register 16.

When the comparator 30 generates an output pulse, the controller enters a trigger display subroutine. In this subroutine, the counter 26 is disabled and accordingly the horizontal display address word provided by the counter 26 remains constant throughout the subroutine. The memory address word provided to the memory 8 remains constant, and therefore the vertical display address word provided by the memory remains constant. The controller applies offsets to the horizontal and vertical display address words through offset circuits 38 and 40 that are connected respectively between the counter 26 and the horizontal DAC 24 and between the waveform memory 8 and the vertical DAC 20. The offsets that are applied to the display address words provided by the counter 26 and the waveform memory 8 cause a letter T to be displayed immediately above the display point represented by the outputs of the counter 26 and the waveform memory 8. The letter T may be composed of a vertical row of three display points and a horizontal row of three display points immediately above the vertical row. The letter T may therefore by generated by applying successive offsets of 1, 2, 3 and 4 LSBs to the vertical display address word provided by the waveform memory 8, applying an offset of $-1$ LSB to the horizontal display address word provided by the counter 26, applying an offset of $+1$ LSB to the horizontal display address word, and then setting the offsets to zero. When the offsets have been set to zero, the subroutine is completed and the counter 26 is enabled once more. The comparator 30 is disabled from providing a further output pulse, and writing of the display on the screen of the CRT continues as before.

By causing the CRT to display the letter T in this manner, the user of the oscilloscope is able to see immediately the approximate location in both the horizontal and vertical direction of the trigger point.

FIG. 2 illustrates a typical display provided by the oscilloscope, and FIG. 3 illustrates a detail of the display. The oscilloscope has two acquisition and display channels, designated channels 1 and 2 respectively. The channel 1 signal is represented by the waveform 41 and the channel 2 signal is represented by the waveform 42. The vertical sensitivity of the oscilloscope is set to 5 v/div. in each channel, and the trigger level is set at 3.67 v, positive going, in channel 1. The display point of the waveform 41 that immediately follows the positive-going transition of the channel 1 signal through 3.67 v is marked by the letter T. The corresponding display point of the waveform 42 is also so marked. FIG. 3 illustrates how the letter T is displayed. In FIG. 3, a display point that is addressed is marked with an X.

For the sake of clarity, it has been assumed for the purpose of the foregoing description that the input signal is sampled in real time and that the sample times occur at equal intervals. However, a repetitive signal may be acquired using equivalent time sampling techniques, in which case the sample times are not necessarily at equal intervals. Nevertheless, if the interval between the start of each repetition and the time of the sample taken during that repetition increases progressively, by equal increments, the sample times are effectively equally spaced. Of course, two or more samples may be taken during a given repetition, and by suitably controlling the addresses in the memory to which the corresponding digital words are written, effectively equal spacing of the sample times can be achieved.

It will be appreciated that the present invention is not restricted to the particular embodiment that has been described, and that variations may be made therein without departing from the scope of the invention as defined in the appended claims and equivalents thereof. For example, although the invention has been described in connection with a hardware implementation, a practical implementation of the invention has been made using software. The invention is not restricted to the type of DSO which has a single waveform memory, so that the acquisition and display modes have to occur sequentially, and may be applied to a DSO of the type that has two waveform memories that are addressable in alternating fashion, so that the two modes of operation occur concurrently. Also, the invention is not restricted to an oscilloscope having a display device that employs a CRT, or indeed to any particular form of display instrument. The invention is not restricted to displaying the letter T to denote the trigger point, and many other visually distinct markers may be used instead. For example, a vertical line, in the manner of a time cursor, may be displayed, or the marker might be a cross having vertical and horizontal limbs that intersect at the selected display point. Instead of creating a marker by addressing additional display points, the marker may be created by causing the selected display point to be addressed at an increased duty cycle, so that it appears with increased intensity. It is not essential that display of the waveform stored in the waveform memory should be interrupted in order to execute the subroutine for marking the trigger point, since the horizontal position word and vertical position word defining the trigger point may be stored and used after the waveform has been written to return the light dot to the selected display point for execution of the subroutine. The invention is not restricted to situations in which the waveform is digitized in real time, and may be applied to cases in which the waveform of a repetitive signal is stored using equivalent time sampling techniques. It is not essential that the first address word generated by the counter 10 after the trigger event be stored explicitly, since if the number of samples that are taken after the trigger event is determined by the controller, the address of the last sample may be stored and the address of the first sample following the trigger event can then be calculated. The invention is applicable to an analog oscilloscope, in which sufficient delay to place the trigger point on screen is provided by a delay line rather than a digital memory.

I claim:

1. A digital storage oscilloscope comprising:
   a display device which has a display surface,
   means for generating a visible dot on the display surface,
   first deflection means for repeatedly deflecting the dot over the display surface along a first axis at a predetermined sweep rate,
   an input terminal for receiving an analog input signal of which the waveform is to be displayed on the display surface,
   an analog-to-digital converter connected to the input terminal for generating a succession of digital data words representative of the instantaneous magnitude of the analog input signal at a succession of sample times that are effectively equally spaced in time through a predetermined display interval,
   a waveform memory having a plurality of separately addressable storage locations,
   memory write means for writing the succession of digital data words to locations of the waveform memory that are defined by memory address words corresponding to the sample times,
   memory read means for reading the digital data words from the waveform memory in timed relationship with respect to deflection of the light dot along said first axis,
   a digital-to-analog converter connected to receive the digital data words read from the waveform memory by the memory read means and generate an analog output signal in response thereto,
   second deflection means for receiving the analog output signal and deflecting the dot over the display surface along a second axis in response thereto, whereby the dot is deflected along said second axis in dependence upon the magnitude of the analog input signal but in delayed relationship with respect thereto and forms a trace of the waveform of the analog input signal during the predetermined display interval,
   a trigger circuit for generating a trigger pulse on the occurrence of a trigger event that indicates a predetermined characteristic of the analog input signal, and
   means for causing a visually distinct marker to be generated on the screen of the display device at a location that represents the time of occurrence of the trigger event.

2. An oscilloscope according to claim 1, wherein the first and second axes are horizontal and vertical respectively, and the first deflection means comprise means for repeatedly generating a predetermined sequence of digital words, and a digital-to-analog converter for converting the digital words to analog form and providing a horizontal deflection signal.

3. An oscilloscope according to claim 1, wherein the location of the visually distinct marker represents the location on the screen of the display device along the first and second axes of the portion of the waveform of the input signal that substantially coincides with the trigger event.

4. An oscilloscope according to claim 1, wherein the first deflection means comprise a display address counter for repeatedly generating a predetermined sequence of digital display address words, and a second digital-to-analog converter connected to receive the digital display address words and generate an analog deflection signal in response thereto, the memory read means comprise means for reading the digital data words from the waveform memory in response to the digital display address words provided by the dispaly address counter, and the means for causing a visually distinct marker to be generated comprise a trigger register responsive to the trigger pulse to store the memory address word corresponding to the first sample time that occurs after the trigger event, and a comparator for comparing the digital display address words with the contents of the trigger register and causing the visually distinct marker to be generated at the location defined by the digital display address word that corresponds to the memory address word stored in the trigger register.

5. An oscilloscope according to claim 4, wherein the trigger circuit is a comparator for comparing the level of the analog input signal with a selected trigger level and generating a trigger pulse when the level of the analog input signal passes through the trigger level in a predetermined direction.

6. An oscilloscope according to claim 1, wherein the trigger cirucit is a comparator for comparing the level of the analog input signal with a selected trigger level and generating a trigger pulse when the level of the analog input signal passes through the trigger level in a predetermined direction.

7. An oscilloscope according to claim 1, comprising sweep means for initiating deflection of the dot along said first axis effectively in timed relationship with respect to the trigger event, whereby the display interval starts before the trigger event occurs.

* * * * *